United States Patent [19]

Ahn

[11] Patent Number: 5,164,881
[45] Date of Patent: Nov. 17, 1992

[54] HIGHLY INTEGRATED SEMICONDUCTOR MEMORY DEVICE AND THE FABRICATION METHOD THEREOF

[75] Inventor: Ji-hong Ahn, Seoul, Rep. of Korea

[73] Assignee: Samsung Electronics Co., Ltd., Kyunggi, Rep. of Korea

[21] Appl. No.: 814,469

[22] Filed: Dec. 30, 1991

[30] Foreign Application Priority Data

Jan. 30, 1991 [KR] Rep. of Korea ............... 91-1589

[51] Int. Cl.⁵ ............ H01G 4/06; H01L 29/68; H01L 21/70
[52] U.S. Cl. ............................ 361/313; 357/23.6; 437/52
[58] Field of Search ............ 361/311, 312, 313; 437/52, 43; 357/51, 23.6

[56] References Cited

U.S. PATENT DOCUMENTS 5,043,780  8/1991  Fazan et al. .................. 357/23.6
5,082,797  1/1992  Chan et al. ...................... 437/52

*Primary Examiner*—Donald Griffin
*Attorney, Agent, or Firm*—Cushman, Darby & Cushman

[57] ABSTRACT

In a highly integrated semiconductor memory device provided with memory cells in matrix form on a semiconductor substrate, each memory cell includes a transistor and a capacitor. The cell capacitor includes a storage electrode in contact with a source region of the transistor. This storage electrode has a plurality of irregularly shaped quasi-cylindrical holes formed therein at random locations. A dielectric film is coated on the whole surface of the storage electrode. Thus, storage electrodes having a large cell capacitance suitable for DRAM cells of highly integrated circuits can be achieved.

16 Claims, 6 Drawing Sheets

HIGHLY INTEGRATED SEMICONDUCTOR MEMORY DEVICE AND THE FABRICATION METHOD THEREOF

BACKGROUND OF THE INVENTION

1. Field of the Invention

The present invention relates to a semiconductor memory device and the fabrication method thereof, and more particularly to a highly integrated semiconductor memory device and the fabrication method thereof, in which the structure of the storage electrode of a capacitor is improved to increase the capacitance of a memory cell having a stack-type capacitor structure.

2. Description of the Prior Art

The development of highly integrated DRAM (Dynamic Random Access Memory) devices has achieved a density four times that of just three years ago, and this trend will continue with the present pace in technical development. Currently, 4 Mb DRAMs are mass-produced, and 16 Mb DRAMs are being rapidly developed to be mass-produced. 64 Mb and 256 Mb DRAMs are actively being studied. Improvement in integration is achieved by decreasing the memory cell area corresponding to a memory unit. Decreasing the size of a memory cell area essentially results in a decrease in storage cell capacitance. Accordingly, a cell's read-out capability is decreased as the soft error rate is increased. Thus, methodologies aimed at increasing cell integration can unwantedly reduce device performance and cause severe problems.

To overcome the drawback of decreased storage cell capacitance due to a decrease in memory cell area, a three dimensional capacitor has been suggested. For example, a stack capacitor, a trench capacitor, or a stack-trench combined capacitor are commonly used. However, as demand for higher packing density further increases, i.e., from 64 Mb to 256 Mb, achieving highly integrated semiconductor memory devices using simple three dimensional capacitors becomes onerous.

Accordingly, several integrated circuit fabrication techniques have been proposed to overcome the difficulty of preserving high capacitance in manufacturing 64 Mb and 256 Mb DRAMs of three-dimensional storage electrodes. They include: a storage electrode of fin structure in IEDM, 1989, by T. Ema et al. at the Fujitsu Institute; a storage electrode of box structure in SSDM conference, 1989; a storage electrode of a spread stacked capacitor (SSC) structure in IEDM, 1989, by S. Inoue et al. at the ULSI Institute of Toshiba; and a storage electrode of cylindrical structure in a VLSI technology symposium, 1989, by W. Wakamiya et al. at the LSI Institute of Mitsubishi.

SUMMARY OF THE INVENTION

It is an object of the present invention to provide a highly integrated semiconductor memory device having a three-dimensional capacitor with a new structure to increase the cell capacitance of a DRAM cell.

It is another object of the present invention to provide a fabrication method suitable for the manufacturing of a highly integrated semiconductor memory device.

To achieve the objects of the present invention, the highly integrated semiconductor memory device of the present invention has memory cells in the form of a matrix on a semiconductor substrate. Each cell includes a transistor and a capacitor. The capacitor includes a storage electrode in contact with a source region of the transistor. The storage electrode has a plurality of irregularly shaped quasi-cylindrical holes formed at random locations. A dielectric film is coated on the whole surface of the storage electrode, and a plate electrode is formed on the dielectric film to complete the capacitor structure.

Manufacture of this capacitor includes the step of depositing a first conductive layer on a semiconductor substrate on which the transistors have been formed.

A mask material is then deposited on the first conductive layer, after which an impurity is deposited on the mask material.

The impurity deposited semiconductor substrate is then heated to dope the impurity into the mask material. This forms bubbles in the mask material. Next, the mask material is etched back to a predetermined depth to open the bubbles, thereby exposing parts of the first conductive layer that are not covered by the remainder of the mask material. Anisotropic etching of the first conductive layer then takes place, to a predetermined depth, using the remainder of the mask material as a mask.

The remainder of the mask material is then removed. Photolithography is then used to define the storage electrode.

A dielectric film is then formed on the storage electrode and a second conductive layer is then deposited on the semiconductor substrate on which the dielectric film has been formed, to form a plate electrode.

BRIEF DESCRIPTION OF THE DRAWINGS

The above objects and other advantages of the present invention will become more apparent by describing the preferred embodiments of the present invention with reference to the attached drawings, in which.

DETAILED DESCRIPTION OF THE PREFERRED EMBODIMENTS

When diffusing an impurity into a semiconductor substrate, there occurs an undesirable bubble generating phenomenon. The present invention suggests a new three dimensional capacitor structure which utilizes the bubble generating phenomenon to increase the cell capacitance.

Figure 1:
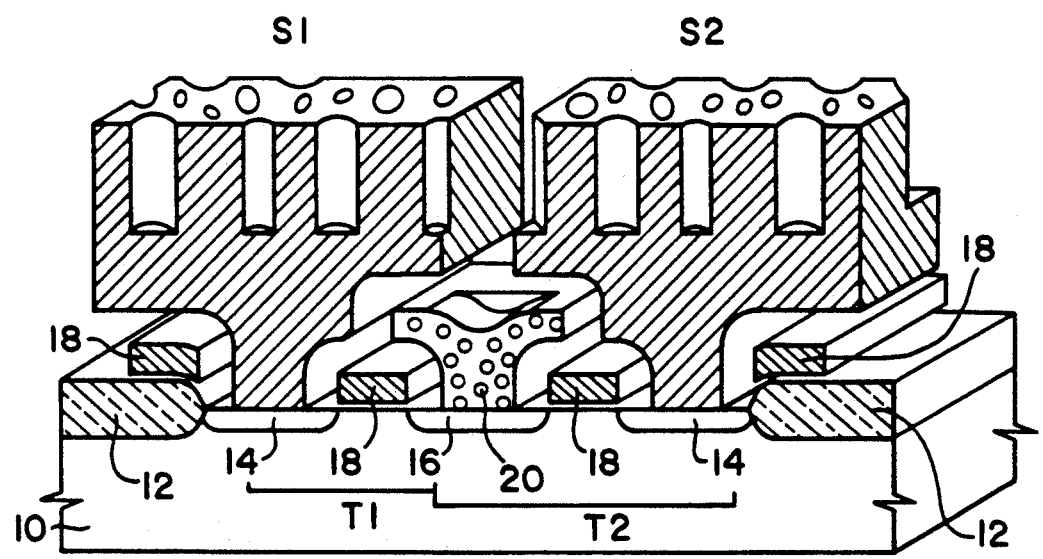
FIG. 1 is a schematic perspective view of a highly integrated semiconductor memory device according to the present invention.

FIG. 1 is a perspective view of a highly integrated semiconductor device according to the present invention.

A pair of transistors T1 and T2 are formed between field oxide regions 12 on semiconductor 10 having common drain region 16. Each transistor is provided with source region 14 and gate electrode 18. In this embodiment, gate electrodes 18 are extended and provided as word lines. Bit line 20 is connected to drain region 16 and storage electrodes S1 and S2 are connected to source region 14 of transistors T1 and T2, respectively.

Each storage electrode S1 and S2 is formed by a conductive layer in which irregularly shaped cylindrical holes are randomly formed, thereby giving it the appearance of a honeycomb. Storage electrodes S1 and S2 define memory cell regions and are connected to source region 14 of each transistor constituting a memory cell. Storage electrodes S1 and S2 extend laterally over field oxide regions 12 in one direction and over bit line 20 in the other direction.

Thus, in well defined memory cell regions storage electrodes S1 and S2 can extend the capacitor's effective area, to store charges, by the exposed surface area of the irregularly shaped cylindrical holes and the exterior surface area of the conductive layer. Because the number of holes is a function of impurity concentration, thermal energy supplied during a heating process, and the duration of the heating process, minimum feature size need not be observed when fabricating the cell capacitor structure of the present invention. The holes (bubbles) are used to create a mask of irregularly shaped openings that have distances between which are much smaller than any mask that could be obtained if the mask were created using a standard etch procedure.

Figure 2:
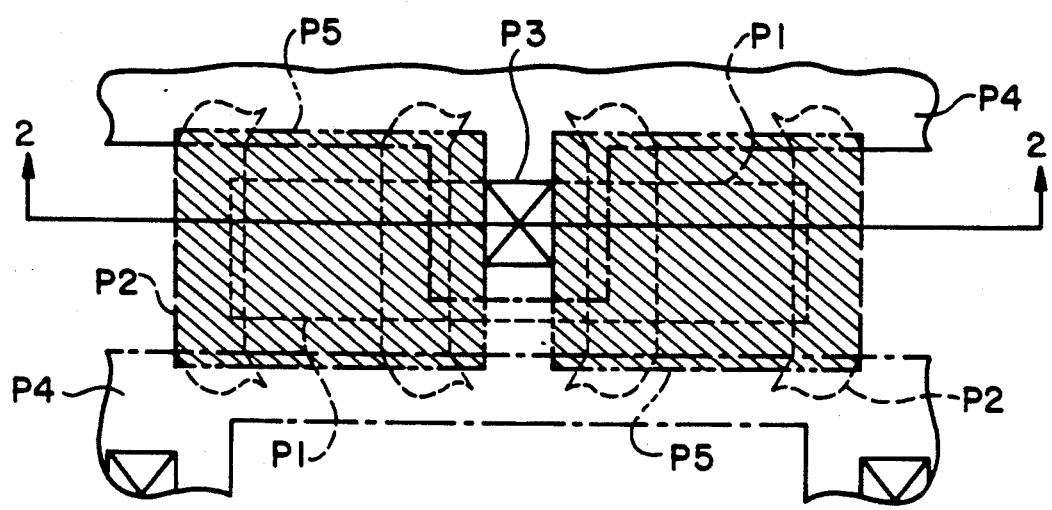
FIG. 2 is a plan view of the highly integrated semiconductor memory device according to the present invention shown in FIG. 1.

FIG. 2 is a plan view of a highly integrated semiconductor memory device according to the present invention. The portion defined with a short broken line and running horizontally is mask pattern P1 defining an active region. The part defined with a long broken line is mask pattern P2 forming a word line. The portion defined with a solid line and having two diagonal lines crossing inside is mask pattern P3 forming a contact hole. The portions defined with a single-dotted line, running along a horizontal direction and having an extruded center to include mask pattern P3 along with its parallel counter part, are mask pattern P4 forming bit lines. The portions defined with double-dotted lines, having oblique lines inside and opposed to each other with respect to mask pattern P3, are mask pattern P5 defining storage electrodes.

Referring to FIGS. 3A to 3E, a fabrication process sequence using a vertical sectional structure taken along the line 2—2 of FIG. 2 is shown. An embodiment of the fabrication process of a highly integrated semiconductor memory device according to the present invention will now be described in greater detail.

Figure 3A:
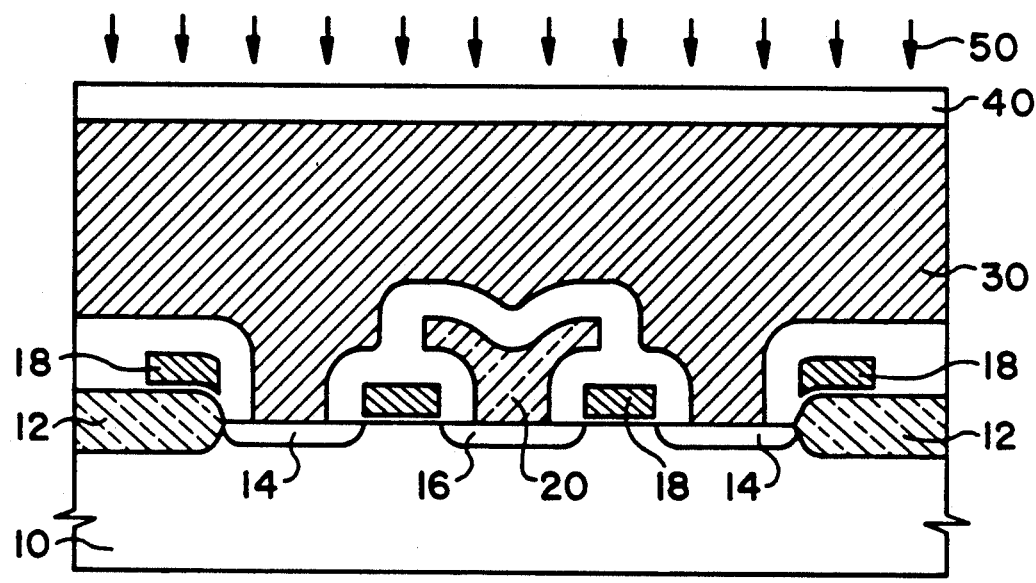
FIGS. 3A through 3E are sectional views taken along the line 2—2 of FIG. 2 and show the fabrication sequence of an embodiment of a highly integrated semiconductor memory device according to the present invention.

First, FIG. 3A shows a process for laminating first conductive layer 30 and mask material 40 on semiconductor substrate 10. Transistors previously formed in semiconductor substrate 10 share drain region 16 and each is provided a source region 14 and a gate electrode 18. Bit line 20 is formed on drain region 16. An impurity 50 is then deposited on mask material 40. First conductive layer 30 can be an impurity doped polycrystalline. First conductive layer 30 is deposited on the whole surface of semiconductor substrate 10 to a thickness of 3,000 Å to 10,000 Å and is used for the formation of storage electrodes S1 and S2. A preferred thickness of 4000 Å to 6000 Å is desirable.

Mask material 40 is then deposited on first conductive layer 30 at a thickness of 500 Å to 3000 Å. The deposited mask material 40 will form bubbles therein when an impurity is diffused. Mask material 40 can be a BPSG (Boro-Phosphor-Silicate Glass) type material.

Impurity 50 is $P_2O_5$ (Phosphorus Pentoxide) and is generated by a chemical reaction of two materials. Thermal energy is supplied to POC13 (Phosphorus Oxychloride) and $O_2$ forming $P_2O_5$. $P_2O_5$ is then diffused by the thermal energy supplied to the substrate after being deposited in mask material 40, i.e., the BPSG film.

Experimentally, it was determined that bubbles are generated inside the BPSG film during the diffusion step. These bubbles vary in shape and number according to the supplied thermal energy, the duration of the diffusion and the amount of the impurity. The sizes of the bubbles can be further controlled by coating of another material (not shown), such as a polycrystalline silicon, to a thickness of 500 Å to 2000 Å over the BPSG film. This is because the impurity can then reach the BPSG film only through the additional material. The preferred size of the bubbles is 0.1–0.2 microns.

Figure 3B:
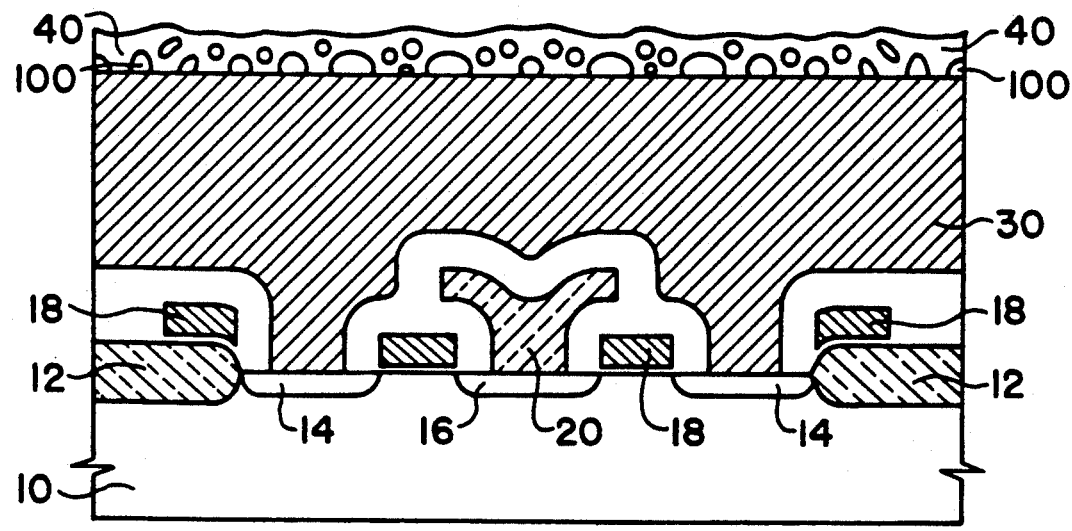

FIG. 3B shows bubbles 100 generated inside mask material 40, i.e., a bubble-filled BPSG film. The thermal energy supplied during the diffusion step changes the BPSG film into a molten state, thereby increasing its thickness by a volume occupied by the bubbles and thus forming an uneven surface (as shown in the drawing).

Figure 3C:
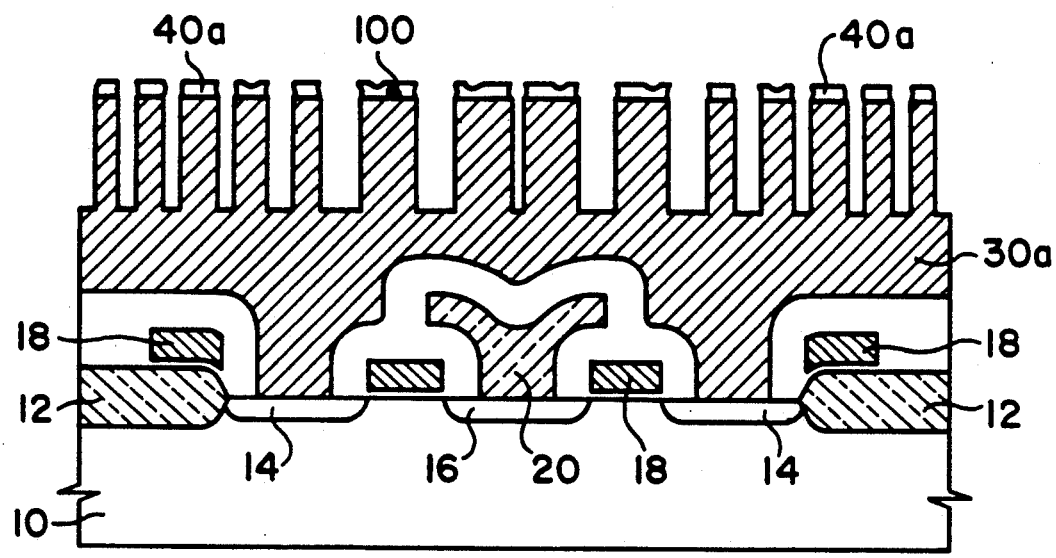

FIG. 3C shows a process for opening bubbles to randomly form irregularly shaped holes in the surface of first conductive layer 30a and then anisotropically etching first conductive layer 30a. Bubbles 100 are opened by etching back the BPSG film. In this case, the etch back step is carried out until the shapes of the bubbles which were in contact with first conductive layer 30 become hemispheres to expose parts of the first conductive layer between remaining portions of mask material 40a.

The whole surface of the first conductive layer is then anisotropically etched to remove the exposed part of first conductive layer 30a using remaining mask material 40a as a mask, such that irregularly shaped cylindrical holes are randomly formed in first conductive layer 30a.

Figure 3D:
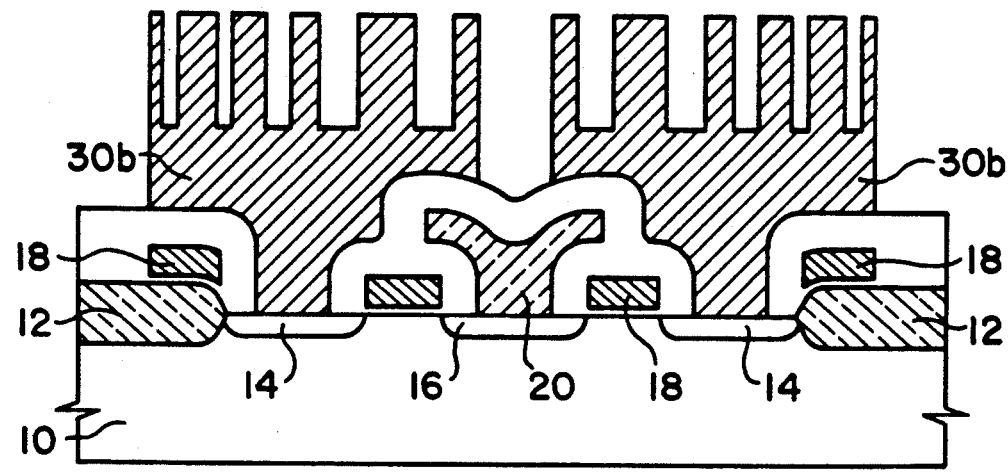

FIG. 3D shows a process for removing remaining mask material 40a and forming storage electrode 30b using mask pattern P5. After remaining mask material 40a is removed by wet etching, an isotropic etching is carried out using mask pattern P5, thereby forming storage electrode 30b for each cell.

Figure 3E:
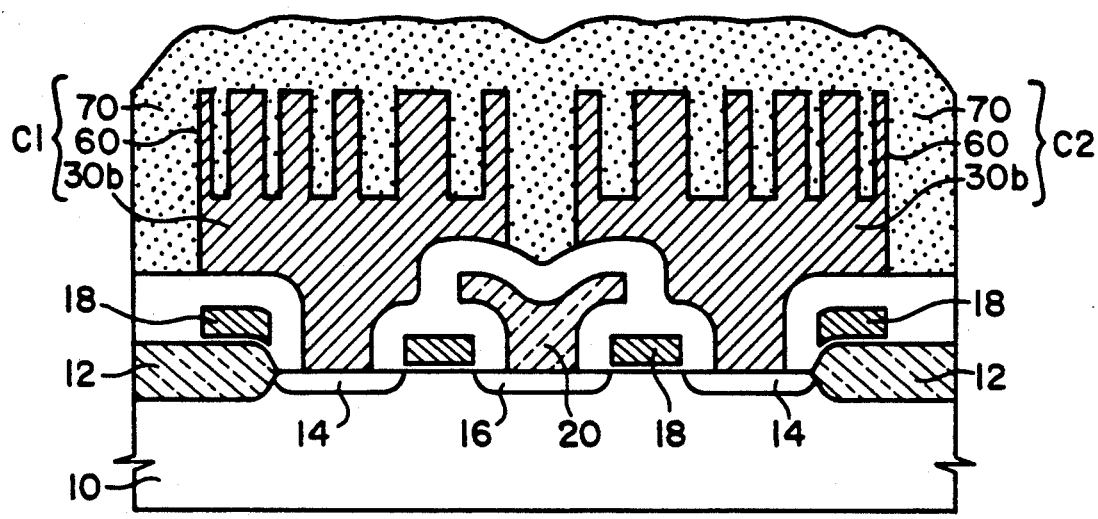

FIG. 3E shows a process for forming dielectric film 60 and plate electrode 70. A dielectric film is formed by coating a dielectric material of a high dielectric constant such as $T_{a2}O_5$ over the whole surface of storage electrode 30b. Plate electrode 70 is then formed by depositing a second conductive layer such as an impurity doped polycrystalline silicon.

Figure 4:
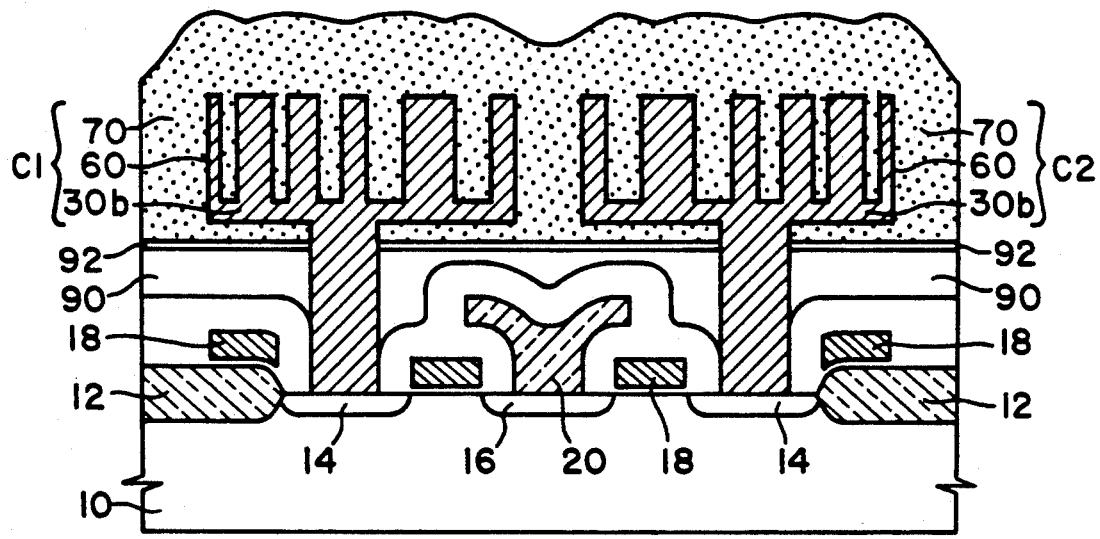
FIG. 4 is a sectional view showing another embodiment of a highly integrated semiconductor memory device according to the present invention.

FIG. 4 is a vertical sectional view of another embodiment of the present invention. In this embodiment, even the lower surface of the storage electrode is used as an effective area of the capacitor, so that a slightly larger capacitance than that of the above-described embodiment is achieved.

This embodiment further comprises the steps of stacking planarized layer 80, etch blocking layer 92 and an insulating layer (not shown) on the surface of the semiconductor substrate, carrying out the steps shown in FIGS. 3A through 3D to form storage electrode 30a and then removing the insulating layer on etch blocking layer 92. The slightly larger area thus achieves an increase in capacitance.

Figure 5:
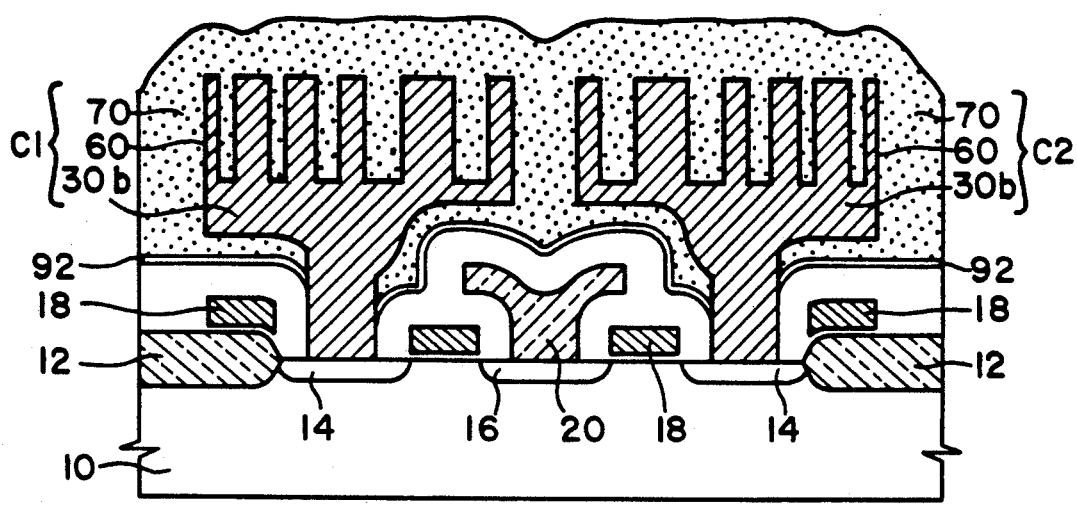
FIG. 5 is a sectional view showing still another embodiment of a highly integrated semiconductor memory device according to the present invention.

FIG. 5 is a vertical sectional view of still another embodiment of the present invention that does not contain planarized layer 90 of FIG. 4. This embodiment also utilizes the lower surface of storage electrode 30b as an effective capacitance area, but the lower surface of storage electrode 30b is now formed along an uneven surface.

Figure 6:
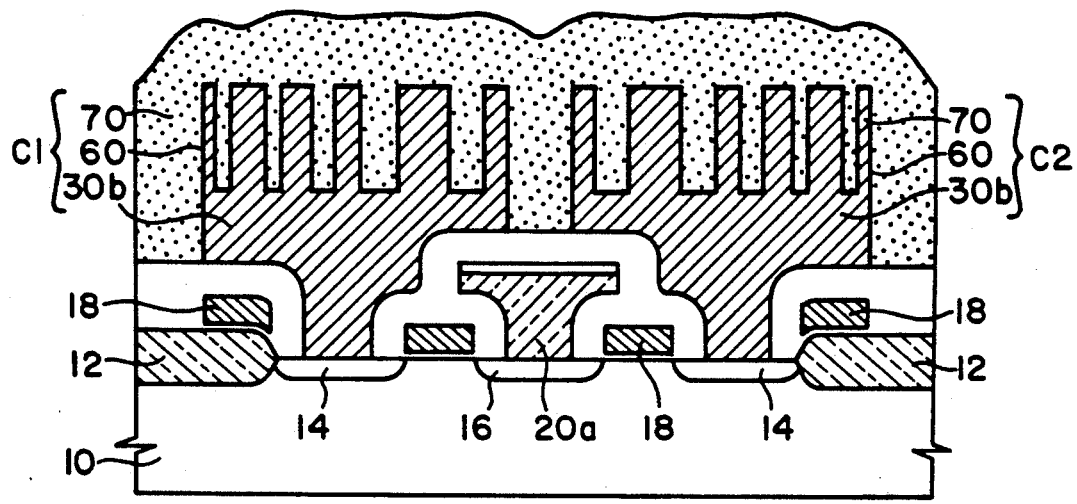
FIG. 6 is a sectional view showing yet another embodiment of a highly integrated semiconductor memory device according to the present invention.

FIG. 6 is a vertical sectional view of yet another embodiment of the present invention. Since bit line 20 is formed as planarized bit line 20a, the resistance in the bit line can be reduced, thereby improving that operational characteristic.

In a highly integrated semiconductor memory device according to the disclosed embodiments of the present invention, a storage electrode is formed by utilizing bubbles generated in an impurity diffusion step. A large cell capacitance is obtained regardless of capacitance limitations dictated by the fabricating equipment being used.

Furthermore, the specific integrated circuit number of etching steps used in the fabrication process of the complete capacitor is reduced. As a result the damage that normally occurs when repeatedly etching portions of an already formed substrate, is reduced. Thus, the process is simplified and also the electrical characteristics of the device are improved.

Moreover, because cell capacitance can be controlled by altering the amount of heat energy supplied in the impurity diffusion, the amount of the impurity, and the diffusion time, the capacitor is simplified. Therefore cell capacitances suitable for DRAM cells of 64 Mb or more is easily achieved.

While this invention has been described in connection with what is presently considered to be the most practical and preferred embodiments, it is to be understood that the invention is not limited to the disclosed embodiment, but, on the contrary, is intended to cover various modifications and equivalent arrangements included within the spirit and scope of the appended claims.

What is claimed is:

1. A capacitor for a highly integrated semiconductor memory device having a plurality of memory cells formed on a semiconductor substrate, each memory cell containing a transistor having a source region and a drain region and a capacitor, said capacitor comprising:
    a storage electrode in electrical contact with said source region of said transistor, said storage electrode having a surface that includes a plurality of irregularly shaped quasi-cylindrical holes formed at random locations in a top surface of said storage electrode;
    a dielectric film formed on said top surface of storage electrode including said irregularly shaped quasi-cylindrical holes; and
    a plate electrode formed on said dielectric film.

2. A capacitor according to claim 1, wherein a lower surface of said storage electrode is planar.

3. A capacitor according to claim 2, wherein said dielectric film includes a lower dielectric portion that covers said planar lower surface of said storage electrode and said plate electrode is formed on the lower dielectric portion of said dielectric film.

4. A capacitor according to claim 1, wherein a lower surface of said storage electrode is unevenly formed.

5. A capacitor according to claim 3, wherein said dielectric film includes a lower dielectric portion that covers said uneven lower surface of said storage electrode and said plate electrode is formed on the lower dielectric portion of said dielectric film.

6. A method of manufacturing a capacitor for a highly integrated semiconductor memory device having a plurality of memory cells formed on a semiconductor substrate, each memory cell containing a transistor having a source region and a drain region and a capacitor, said method comprising the steps of:
    depositing a first conductive layer having upper and lower surfaces on said semiconductor substrate on which said source and drain regions of said transistors have been formed to establish electrical connection between said source region and said first conductive layer at said lower surface;
    depositing a mask material on said upper surface of said first conductive layer;
    depositing an impurity on said mask material which will generate bubbles when diffused into said mask material;
    heating said impurity deposited semiconductor substrate to diffuse said impurity into said mask material, thereby forming bubbles in said mask material;
    etching said mask material to a predetermined depth to open holes in said mask corresponding to said bubbles, thereby exposing only partially said first conductive layer and obtaining a remaining mask portion;
    anisotropically etching said first conductive layer to a predetermined depth using said remaining mask portion to form a plurality of holes corresponding in shape to said bubbles;
    removing said remaining mask portion;
    separating said first conductive layer into respective cells by etching, thereby completing a storage electrode;
    forming a dielectric film on the whole surface of said storage electrode; and
    depositing a second conductive layer on said dielectric film to form a plate electrode of said capacitor.

7. A method of manufacturing a capacitor according to claim 6, wherein said step of depositing said first conductive layer deposits polycrystalline silicon doped with an impurity.

8. A method of manufacturing a capacitor according to claim 7 wherein said first conductive layer is 4000 Å to 6000 Å thick.

9. A method of manufacturing a capacitor according to claim 6, wherein said step of depositing said mask material deposits BPSG.

10. A method of manufacturing a capacitor according to claim 9 wherein the thickness of said BPSG deposited is 500 Å to 3000 Å.

11. A method of manufacturing a capacitor according to claim 6, wherein during said impurity deposition step $POCl_3$ reacts with $O_2$ to produce $P_2O_5$.

12. A method of manufacturing a capacitor according to claim 6 wherein said step of forming a mask material further includes the step of depositing a masking polycrystalline silicon layer on said mask material prior to said step of depositing said impurity.

13. A method of manufacturing a capacitor according to claim 12 wherein said masking polycrystalline silicon layer is deposited to a thickness of 500 Å to 2000 Å.

14. A method of manufacturing a capacitor according to claim 6 wherein the number of said bubbles and their sizes are controlled by a combination of concentration of said impurity, a supplied thermal energy, and a time period of said heating step.

15. A method of manufacturing a capacitor according to claim 6 wherein, prior to said first conductive layer deposition step, the further steps are included of:

depositing a planarized layer over said substrate;
depositing an etch blocking layer over said planarized layer; depositing an insulating layer over said etch blocking layer; and, after said step of removing said mask portion, the step is included of removing said deposited insulating layer to thereby increase an exposed area of said storage electrode over which said dielectric film will be formed during said step of forming said dielectric film.

16. A method of manufacturing a capacitor according to claim 15 wherein said planarized layer is removed.

* * * * *